United States Patent
Pan et al.

(10) Patent No.: US 10,134,478 B2
(45) Date of Patent: *Nov. 20, 2018

(54) APPARATUSES AND METHODS FOR REDUCING READ DISTURB

(71) Applicant: Micron Technology, Inc., Boise, ID (US)

(72) Inventors: Feng Pan, Fremont, CA (US); Ramin Ghodsi, San Jose, CA (US); Qiang Tang, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/436,289

(22) Filed: Feb. 17, 2017

(65) Prior Publication Data

US 2017/0162269 A1  Jun. 8, 2017

Related U.S. Application Data

(63) Continuation of application No. 14/518,727, filed on Oct. 20, 2014, now Pat. No. 9,595,339.

(51) Int. Cl.
*G11C 16/26* (2006.01)
*G11C 16/34* (2006.01)
*G11C 16/24* (2006.01)
*G11C 16/04* (2006.01)
(Continued)

(52) U.S. Cl.
CPC ...... *G11C 16/3427* (2013.01); *G11C 16/0483* (2013.01); *G11C 16/08* (2013.01); *G11C 16/16* (2013.01); *G11C 16/24* (2013.01); *G11C 16/26* (2013.01)

(58) Field of Classification Search
None
See application file for complete search history.

(56) References Cited

U.S. PATENT DOCUMENTS

| 7,778,086 B2 | 8/2010 | Yu et al. |
| 8,670,285 B2 | 3/2014 | Dong et al. |
| 9,042,177 B2 | 5/2015 | Aritome |

(Continued)

FOREIGN PATENT DOCUMENTS

| JP | 2012069606 A | 4/2012 |
| JP | 2014186761 A | 10/2014 |

OTHER PUBLICATIONS

Micheloni, et al., "NAND Overview: From Memory to Systems", Inside NAND Flash Memories, Jul. 27, 2010, p. 19-53.

*Primary Examiner* — Douglas King
(74) *Attorney, Agent, or Firm* — Dorsey & Whitney LLP

(57) ABSTRACT

Apparatuses and methods for reducing read disturb are described herein. An example apparatus may include a first memory subblock including a first select gate drain (SGD) switch and a first select gate source (SGS) switch, a second memory subblock including a second SGD switch and a second SGS switch, and an access line associated with the first and second memory subblocks. The apparatus may include a control unit configured to enable the first and second SGD switches and the first and second SGS switches during a first portion of a read operation and to provide a first voltage on the access line during the first portion. The control unit may be configured to disable the first SGD switch and the first SGS switches during a second portion of the read operation and to provide a second voltage on the access line during the second portion.

15 Claims, 5 Drawing Sheets

(51) Int. Cl.
*G11C 16/08* (2006.01)
*G11C 16/16* (2006.01)

(56) References Cited

U.S. PATENT DOCUMENTS

| | | |
|---|---|---|
| 9,136,007 B2 | 9/2015 | Shirakawa |
| 9,460,792 B2 | 9/2016 | Pan et al. |
| 9,672,918 B2 | 6/2017 | Hashimoto |
| 2005/0265076 A1 | 12/2005 | Forbes |
| 2006/0044872 A1 | 3/2006 | Nazarian |
| 2007/0263462 A1 | 11/2007 | Roohparvar |
| 2008/0181020 A1 | 7/2008 | Yu et al. |
| 2010/0074015 A1 | 3/2010 | Chandrasekhar et al. |
| 2011/0019495 A1 | 1/2011 | Scheuerlein et al. |
| 2012/0039130 A1 | 2/2012 | Yoon et al. |
| 2012/0069663 A1 | 3/2012 | Itagaki et al. |
| 2012/0250420 A1 | 10/2012 | Shirakawa et al. |
| 2012/0320678 A1 | 12/2012 | Maejima et al. |
| 2013/0170299 A1 | 7/2013 | Yip |
| 2013/0258779 A1 | 10/2013 | Liu |
| 2013/0272069 A1 | 10/2013 | Rabkin et al. |
| 2014/0036590 A1 | 2/2014 | Feeley et al. |
| 2014/0040538 A1 | 2/2014 | Seo et al. |
| 2014/0063960 A1 | 3/2014 | Goda et al. |
| 2014/0071758 A1 | 3/2014 | Toshiba |
| 2014/0160850 A1 | 6/2014 | Liu |
| 2014/0211563 A1 | 7/2014 | Chang et al. |
| 2014/0241060 A1 | 8/2014 | Ha |
| 2014/0241092 A1 | 8/2014 | Ha |
| 2014/0286099 A1 | 9/2014 | Shirakawa |
| 2015/0023103 A1 | 1/2015 | Aritome |
| 2016/0012915 A1 | 1/2016 | Magia et al. |
| 2016/0071593 A1 | 3/2016 | Hashimoto |
| 2016/0111160 A1 | 4/2016 | Pan et al. |
| 2016/0111167 A1 | 4/2016 | Pan et al. |
| 2017/0018309 A1 | 1/2017 | Pan et al. |

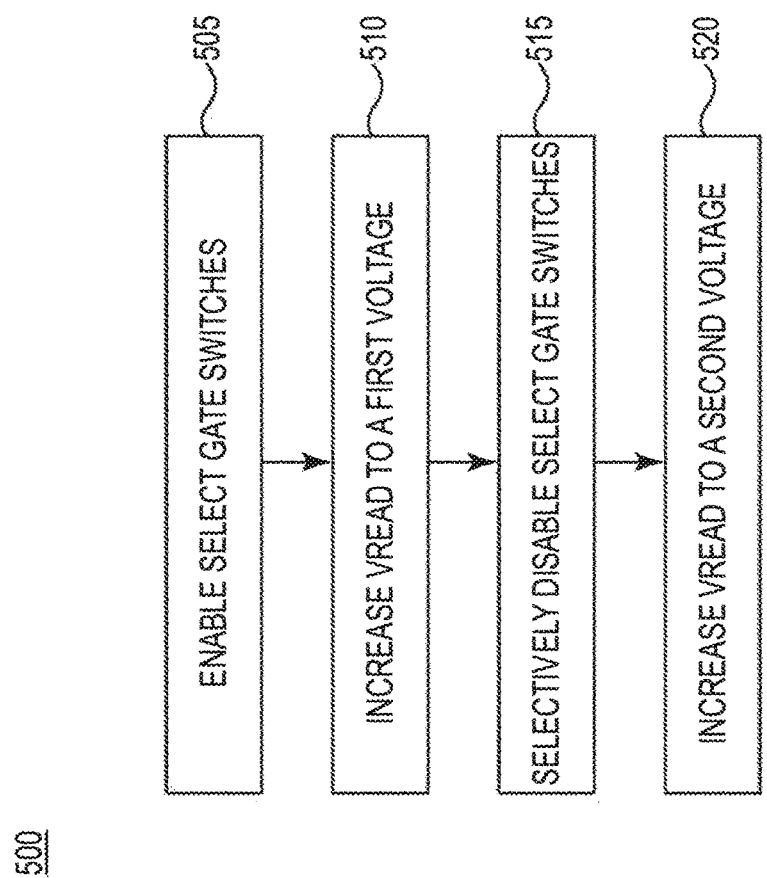

APPARATUSES AND METHODS FOR REDUCING READ DISTURB

CROSS-REFERENCE TO RELATED APPLICATION(S)

This application is a continuation of U.S. patent application Ser. No. 14/518,727, filed Oct. 20, 2014, issued as U.S. Pat. No. 9,595,339 on Mar. 14, 2017. The afore-mentioned application and patent are incorporated by reference herein, in their entirety, and for any purposes.

BACKGROUND

Memory cell density, such as that of non-volatile memory, has been improved significantly in an effort to achieve greater storage capacity, while not significantly increasing cost or memory footprint. One widely adopted solution has been to implement memory cells in three-dimensions, for instance, using vertically oriented NAND strings.

Implementing memories in this manner has presented challenges, however. By way of example, as a result of three-dimensional implementation, block sizes have increased, and as a corollary, capacitive and resistive loads generated during operation, as well as cell leakage, have increased as well.

BRIEF DESCRIPTION OF THE DRAWINGS

FIG. 5 is a flowchart of a method for performing a read operation according to an embodiment of the present invention.

DETAILED DESCRIPTION

Apparatuses and methods for reducing read disturb in a memory are described herein. Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
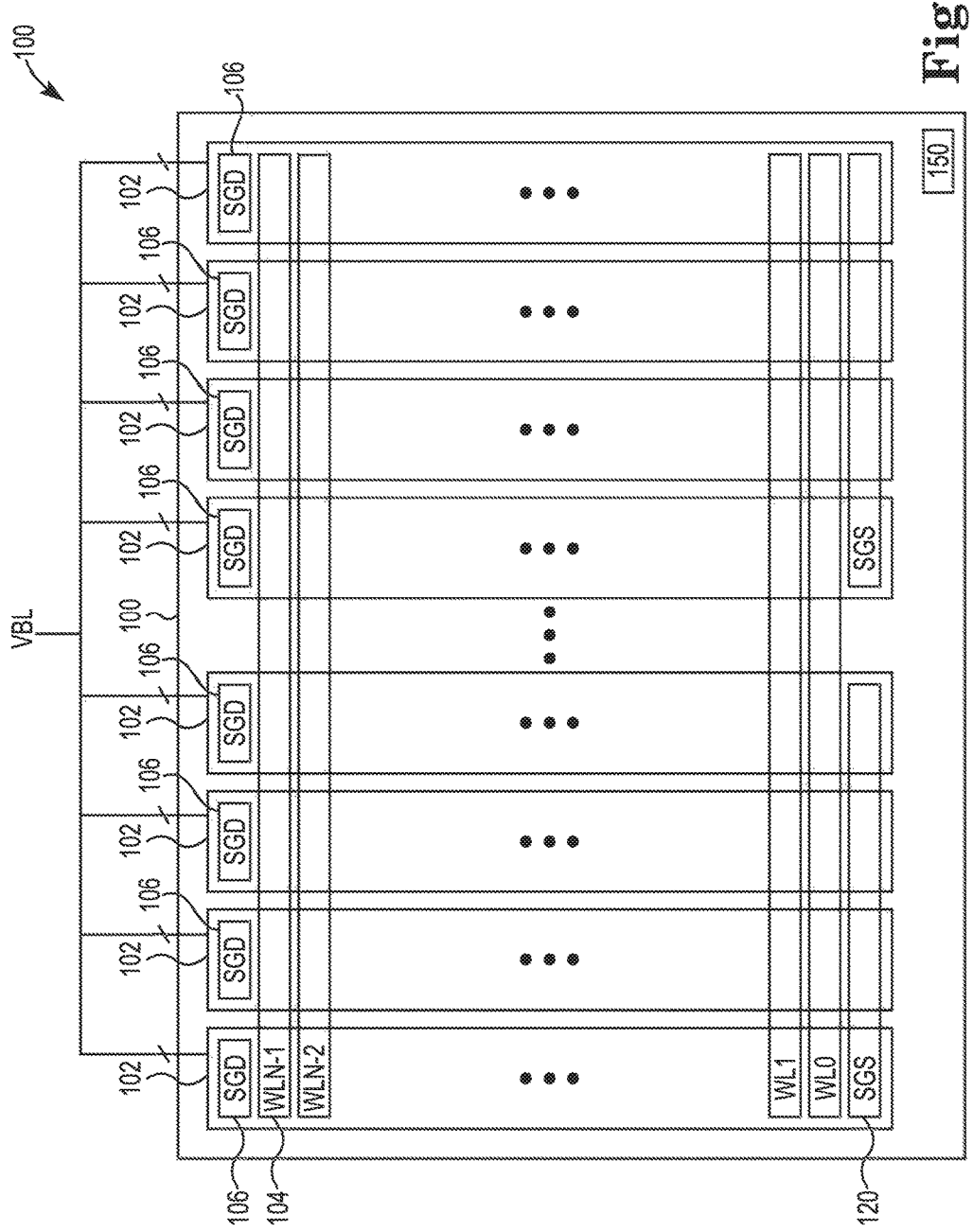
FIG. 1 is a schematic block diagram of an apparatus including a memory block according to an embodiment of the present invention.

FIG. 1 is a block diagram of an apparatus that includes a memory block 100 according to an embodiment of the present invention. As used herein, apparatus may refer to, for example, an integrated circuit, a memory device, a memory system, an electronic device or system, a smart phone, a tablet, a computer, a server, etc. The memory block 100 includes a plurality of memory subblocks 102, a plurality of memory access lines 104, a plurality of select gate drain (SGD) control lines 106, a plurality of select gate source (SGS) control lines 120, and control unit 150. Each of the SGD control lines 106 may be associated with a respective memory subblock 102 and each of the SGS control lines 120 may be associated with a respective plurality of memory subblocks 102.

In some examples, each of the memory subblocks 102 may include a plurality of memory cells, such as non-volatile memory cells (e.g., NAND memory cells) that may be arranged in rows and/or columns. In some examples, each of the memory cells may be a single-level cell (SLC) and/or may be a multi-level cell (MLC). In this manner, each memory cell may be programmed to distinct voltage states, each of which may correspond to a particular representation of binary data (e.g., single bit data 0, 1, multi-bit data 00, 01, 10, 11). Because each plurality of memory cells may include NAND memory cells, each plurality of memory cells may be implemented using one or more NAND strings within each memory subblock 102. Each string may, for instance, include 32 non-volatile memory cells, or may include a greater or lesser number of memory cells, and memory cells of each string may share a common channel. Each memory subblock 102 may include any number of strings.

Figure 3:
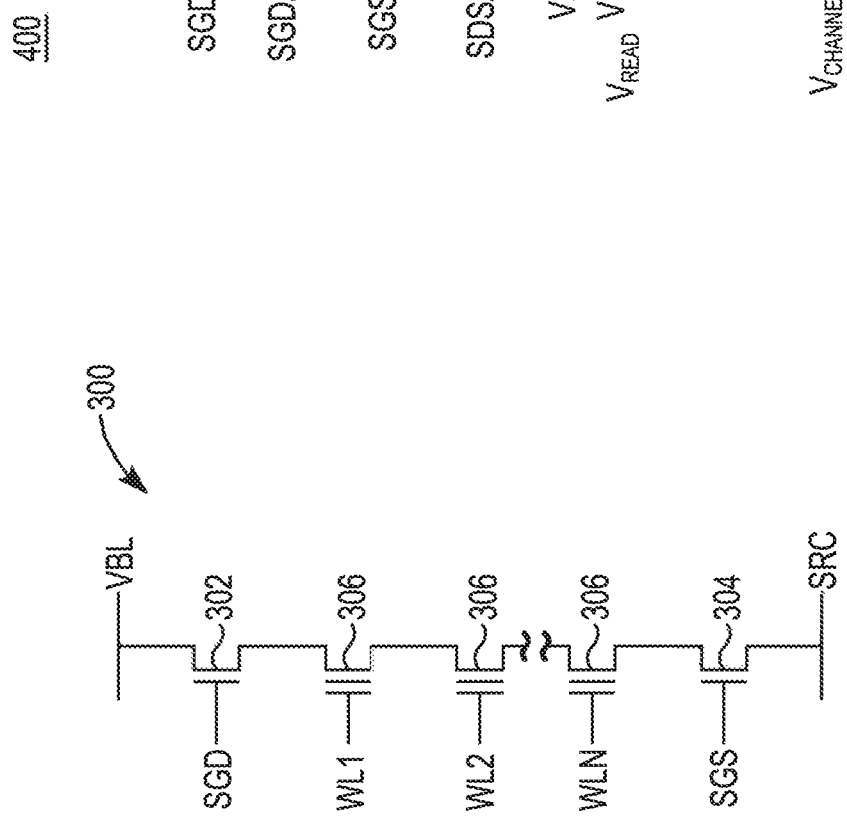
FIG. 3 is a schematic diagram of a NAND string according to an embodiment of the present invention.

With reference to FIG. 3, each string may include a select gate drain (SGD) switch 302 located at a first end of the string and a select gate source (SGS) switch 304 located at a second end of the string opposite the first end. The SGD switch and the SGS switch may be implemented as transistors, as shown in the embodiment of FIG. 3. The memory cells 306 of the string may be coupled in a series configuration between the SGD switch and the SGS switch. Each of the memory cells 306 of the string may be coupled to a respective memory access line WL that may be used to access the memory cell. Memory access line drivers (not shown in FIG. 3) may provide various voltages to the memory access lines WLs during memory operations, for example, during program operations, read operations, erase operations, as well as other memory operations.

Returning to FIG. 1, in some examples, an SGD switch may be configured to selectively couple a string to a signal line VBL and an SGS switch may be configured to selectively couple a string to a source line SRC (VBL and SRC not shown in FIG. 1). By way of example, an SGD switch of a string included in a memory subblock 102 may be coupled to a respective SGD control line 106 associated with the memory subblock 102. Providing (e.g., asserting) an active control signal on the SGD control line 106 may enable the respective SGD switch, thereby coupling the associated string to the signal line VBL. An SGD control line 106 providing an active control signal to enable the SGD switch in this manner is described herein as an "active" SGD control line 106. Similarly, an SGS switch of a string included in a memory subblock 102 may be coupled to an SGS line 120 associated with the memory subblock 102. Providing an active control signal on the SGS line 120 may enable the SGS switch, thereby coupling the respective string to the source line. An SGS control line 120 providing an active control signal to enable the SGS switch in this manner is described herein as an "active" SGS control line 120.

Providing an inactive control signal on the SGD control line 106 may disable the respective SGD switch, thereby decoupling the associated string from the signal line VBL. An SGD control line 106 providing an inactive control signal to disable the SGD switch in this manner is described herein as an "inactive" SGD control line 106. Similarly, an SGS switch of a string included in a memory subblock 102 may be decoupled from an SGS line 120 associated with the memory subblock 102. Providing an inactive control signal on the SGS line 120 may disable the SGS switch, thereby decoupling the respective string from the source line. An SGS control line 120 providing an inactive control signal to disable the SGS switch in this manner is described herein as an "inactive" SGS control line 120.

In some examples, control signals provided on respective SGD control lines 106 and SGS control lines 120, respectively, may be provided by control unit 150. The control unit 150 may be coupled to each of the SGD control lines 106 and the SGS control lines 120, and further may be configured to provide active and/or inactive control signals to perform respective memory operations. The control unit 150 may be implemented in software and/or hardware, and may include any circuitry and/or logic required to perform operations. In some examples, the control unit 150 may be included in the block 100, and in other examples, the control unit 150 may be located outside of the block 100 and may, for instance, be distributed among one or more of a row decoder, an address decoder, control logic coupled to the block 100 and a controller (not shown in FIG. 1).

Each SGD control line 106 may be associated with a respective memory subblock 102 of the block 100, each memory access line 104 may be associated with all memory subblocks 102 of the block 100, and/or each SGS control line 120 may be associated with a respective plurality of memory subblocks 102 of the block 100. Accordingly, each SGD control line 106 may be included, at least in part, in a respective memory subblock 102 and may be coupled to the SGD switch of the corresponding memory subblock 102. In this manner, each active SGD control line 106 may couple the string or strings of a respective memory subblock 102 to a set of signal lines shared, for instance, by each memory subblock 102. A memory access line 104 may be coupled to a memory cell of a string in each memory subblock 102 of the block 100. As a result, a memory access line 104 may span across all memory subblocks 102 of the block 100 and may be coupled to each memory cell of a particular row of memory cells. Each SGS control line 120 may span across an associated plurality of memory subblocks 102 and may be coupled to the SGS switches of the associated memory subblocks 102. In this manner, an active SGS control line 120 may couple strings of the associated plurality of memory subblocks 102 to a source line SRC. In some examples, SGD control lines 106 and/or SGS control lines 120 may span memory subblocks 102 in a same direction as memory access lines 104 such that the SGD control lines 106, memory access lines 104, and/or SGS control lines 120 are substantially parallel. In other examples, SGD control lines 106, and/or SGS control lines 120 may span memory subblocks in an orthogonal direction or other non-parallel directions relative to memory access lines 104. SGD and SGS control lines 106, 120 may be, for instance, substantially parallel to one or more signal lines. Because each SGS control line 120 may be associated with a respective plurality of memory subblocks 102, at any given time during memory operations, SGS switches coupled to an active SGS control line 120 may be enabled while SGS switches coupled to an inactive SGS control line 120 may be disabled.

In some examples, any ratio of SGD control lines 106 to SGS control lines 120 and/or any ratio of memory access lines 104 to SGS control lines 120 may be achieved. By way of example, the block 100 may include 32 memory subblocks 102 and each SGS control line 120 may be coupled to the SGS switches of strings for 4 memory subblocks 102 of the block 100. Accordingly, a 4:1 ratio of SGD control lines 106 to SGS control lines 120 and a 1:8 ratio of memory access lines 104 to SGS control lines 120 may be achieved. In other examples, each SGS control line 120 may be coupled to the SGS switches of strings for 2, 8, 16, 32, 64, or any other number of memory subblocks 102. It will be appreciated that in some examples, each SGS control line 120 may be coupled to the SGS switches of strings for a same number of memory subblocks 102, and that in other examples, SGS control lines 120 may be coupled to the SGS switches of strings for differing numbers of memory subblocks 102. A first SGS control line 120, for instance, may be coupled to the SGS switches of strings for 8 memory subblocks and a second SGS control line 120 may be coupled to the SGS switches of strings for 16 memory subblocks 120.

Generally, memory operations (e.g., read operations, program operations, erase operations) may be performed on one or more selected memory subblocks 102 while all other memory subblocks 102 may be unselected. Performing a memory operation on one or more selected memory subblocks 102 may include selectively enabling SGD switches, SGS switches, and/or memory cells. Description of memory operations is made herein with respect to individual memory subblocks 102. It will be appreciated, however, that in some examples, one or more described operations may be applied simultaneously to any number of memory subblocks 102. Moreover, reference is made herein to selectively enabling SGD and SGS switches to perform memory operations. As described, SGD and SGS switches may be enabled by providing control signal on SGD control lines 106 or SGS control lines 120, respectively, and control signals provided in this manner may be provided by the control unit 150.

In an erase operation, for example, SGD and SGS switches may be disabled. For each row, a low voltage, such as ground potential (e.g., 0 V), may be applied to the memory access line 104 associated with the row, thereby erasing the voltage state of each memory cell. In some examples, erase operations may be implemented at a block level and accordingly one or more memory subblocks 102 may be erased simultaneously. As a result, all SGD lines 106 and all SGS lines 120 may have a low voltage during an erase operation to disable the SGD and SGS switches.

Typically, program operations are performed on erased memory cells, and as a result, only memory cells of a memory subblock 102 intended to be adjusted from an erased voltage state to a different voltage state need be programmed. In an example programming operation, each row of a memory subblock 102 may be programmed sequentially. By way of example, for each row, signal lines associated with a cell to be programmed may be precharged to a first precharge voltage (e.g., 0-1 V) and signal lines associated with a cell not to be programmed may be precharged to a second precharge voltage (e.g., 2-3 V) that may for instance, be higher than the first precharge voltage. A relatively high voltage (e.g., 15 V) may be applied to a memory access line 104 corresponding to the row being programmed, while an intermediate voltage (e.g., 8 V) may be applied to all other memory access lines 104. A magnitude of the intermediate voltage may be greater than a voltage of the voltage state having a highest magnitude to ensure that all memory cells of the memory subblock 102 are conductive. Thereafter, an SGD control line 106 associated with the selected memory subblock 102 may become active and SGD switches associated with strings to be programmed may be selectively enabled (while SGS switches may remain disabled) to program cells of the row. Because signal lines associated with cells not to be programmed have a higher precharge voltage, SGD switches associated with those signal lines may remain disabled and prevent programming of respective cells. In some examples, the relatively high voltage applied to the memory access line 104 may be incrementally increased until each cell of the target row achieves a desired voltage level. During the programming operation. SGD and SGS switches of unselected memory subblocks 102 may be disabled.

In an example read operation, each signal line may be precharged to a voltage (e.g., 0.3 V), and both the SGD and SGS switches of a memory subblock 102 may be enabled. Because each SGS control line 120 may be associated with a respective plurality of memory subblocks 102, SGS switches of one or more other memory subblocks 102 associated with the same SGS control line 120 may be enabled as well. Thereafter, a relatively low voltage (e.g., 0-2 V) may be applied to a memory access line 104 associated with a row to be read, while one or more intermediate voltages (e.g., 4 V, 8 V) may be applied to all other memory access lines 104. In some examples, the relatively low voltage may be a voltage having a magnitude between voltage levels of particular voltage states. Further, as described, a magnitude of one or more intermediate voltages may be greater than a voltage of the voltage state having a highest magnitude to ensure that all memory cells of the memory subblock 102 are conductive.

In some examples, a first access voltage may be applied for a first portion of the read operation and a second access voltage may be applied for a second portion of the read operation thereafter. The second access voltage may be greater than the first access voltage. The SGD switches may be disabled, and the voltage of each signal line may be used to determine the voltage state of each memory cell of the row. In some examples, during the read operation, SGD switches of unselected memory subblocks 102 may be disabled, and SGS switches of memory subblocks 102 not associated with the active SGS line 120 of the read operation may be disabled. In other examples, SGD switches and/or SGS switches of unselected memory blocks 102 may be enabled for a portion of the read operation. By way of example, SGD and SGS switches may be enabled prior to the second access voltage being applied to memory access lines 104. As will be explained in more detail below, enabling SGD and/or SGS switches in this manner may reduce read disturb during the read operation. As known, read disturb may negatively affect the integrity of data stored by the memory cells disturbed and reducing the effect of read disturb may improve data integrity.

Figure 2:
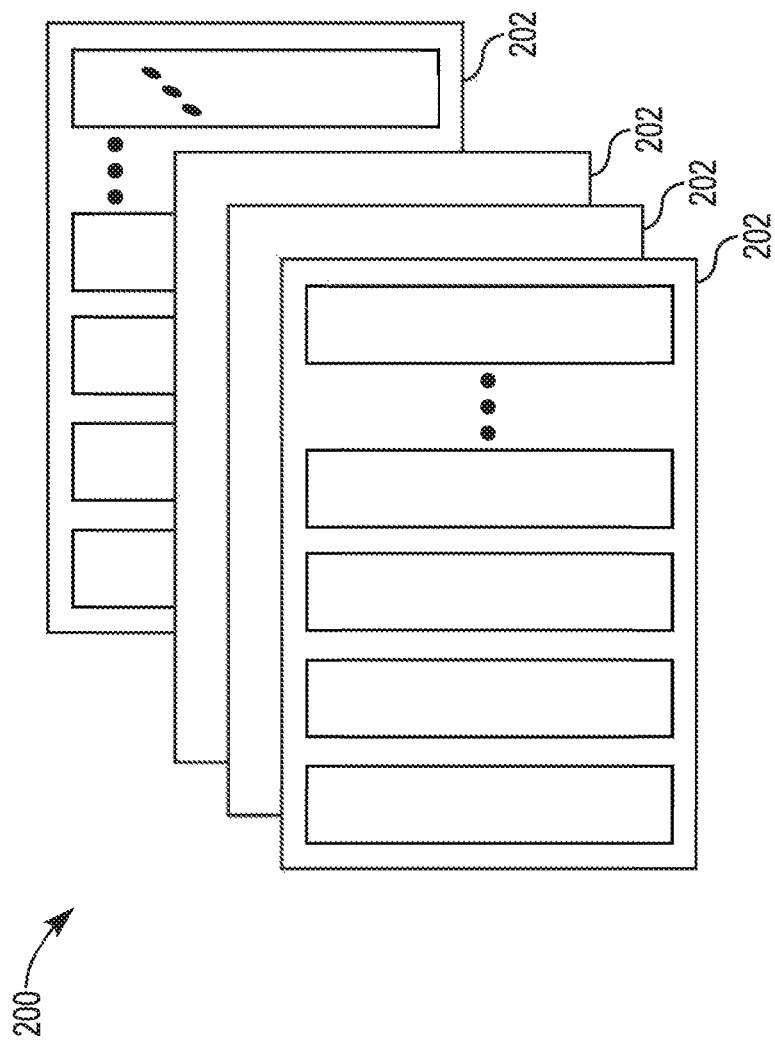
FIG. 2 is a block diagram of a three-dimensional memory array according to an embodiment of the present invention.

In some examples, the block 100 may be implemented in a three-dimensional arrangement. FIG. 2 is a block diagram of a three-dimensional memory array 200 according to an embodiment of the present invention. The three-dimensional memory array 200 may include any number of blocks 202, one or more of which may be implemented using the block 100 of FIG. 1. By way of example, the three-dimensional memory array 200 may include 32 blocks 202, or may include 64 blocks 202. In some examples, memory cells of each block 202 may be accessed concurrently, simultaneously, and/or in an otherwise overlapping manner such that data may be read from, programmed to, and/or erased from multiple blocks 202 in accordance with one or more memory operations. In other examples, the blocks 202 may be configured to share one or more components, such as signal lines and/or control lines.

FIG. 3 is a schematic diagram of a NAND string 300 according to an embodiment of the present invention. The NAND string 300 may include an SGD switch 302, an SGS switch 304, and memory cells 306. As previously described, the SGD switch 302 may be located at a first end of the NAND string 300 and may be configured to selectively couple the NAND string 300 to a signal line VBL responsive to receipt of an active control signal provided to the SGD switch 302. The control signal may be provided, for instance, on an SGD control line coupled to the SGD switch 302, such as an SGD control line 106 of FIG. 1. Similarly, the SGS switch 304 may be located at a second end of the NAND string 300 and may be configured to selectively couple the NAND string 300 to a source line SRC responsive to receipt of an active control signal provided to the SGS switch 304. The control signal may be provided, for instance, on an SGS control line coupled to the SGS switch 304, such as an SGS control line 120 of FIG. 1. Each of the memory cells 306 may be coupled in a series configuration between respective SGD and SGS switches and may be activated by a respective memory access line WL.

Figure 4:
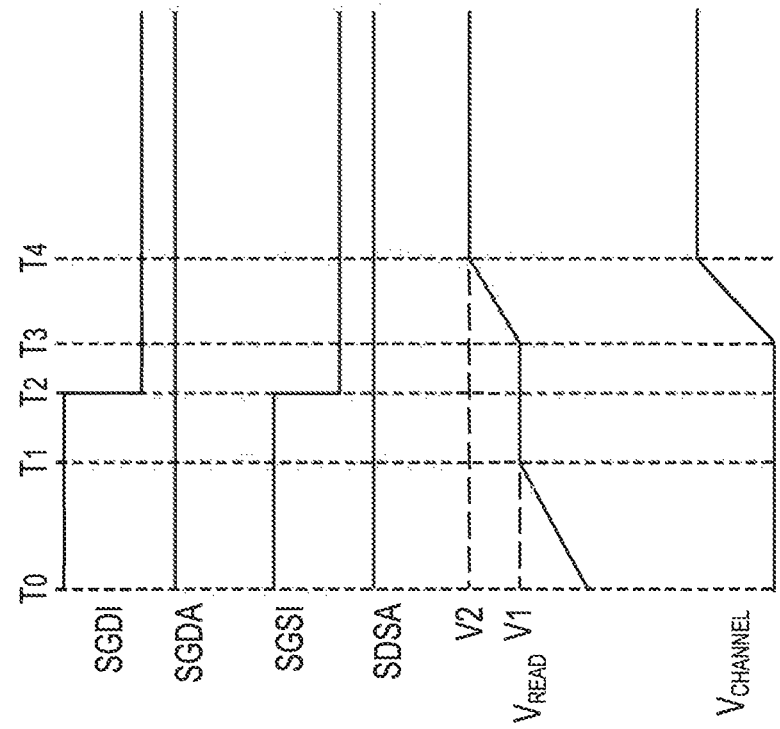
FIG. 4 is a timing diagram illustrating various signals of a read operation according to an embodiment of the present invention.

A read operation according to an embodiment of the invention will be described with reference to FIGS. 4 and 5. FIG. 4 is a timing diagram 400 illustrating various signals of a read operation according to an embodiment of the present invention. FIG. 5 is a flowchart of a method 500 for performing a read operation according to an embodiment of the present invention.

Description of the read operation is made with reference to control signals SGDI, SGDA, SGSI, SDSA, and VREAD, and a channel voltage VCHANNEL. The control signals SGDI and SGSI may be control signals provided to SGD switches and SGS switches, respectively, of unselected memory subblocks to selectively enable the SGD and SGS switches during the read operation. Similarly, the control signals SGDA and SDSA may be control signals provided to SGD switches and SGS switches, respectively, of a selected memory subblock 102 to selectively enable the SGD and SGS switches during the read operation. As described, because SGS control lines, such as the SGS control lines 120, may be associated with a plurality of memory subblocks, one or more unselected memory subblocks may receive the control signal SGSA instead of the control signal SGSI. The control signal VREAD may be a control signal provided to access lines 104 not associated with a row being read during the read operation. The voltage VCHANNEL may be a voltage of a channel of one or more strings of unselected memory subblocks. Each of the control signals SGDI, SGDA, SGSI, SDSA, and VREAD may be provided by the control unit 150 of FIG. 1.

In operation, with reference to FIG. 5, at a step 505, the control unit 150 may cause the control signals SGDI, SGSI, SGDA, and SDSA to be active (e.g., have a high logic level) such that all SGD and SGS switches of all memory subblocks 102 are enabled at a time T0. Additionally, at a step 510, the control unit 150 may increase a voltage level of the control signal VREAD from the time T0, for instance, until the voltage level of the control signal VREAD reaches a first access voltage V1 (e.g., 4 V) at a time T1. The signal lines VBL and SRC are at a low voltage during steps 505 and 510. Because the SGD and SGS switches are enabled during the increase of the voltage level of the control signal VREAD, the channel voltage VCHANNEL may be held at a same magnitude such that the channel voltage VCHANNEL does not increase.

At a step 515, the control unit 150 may cause the control signals SGDI and SGSI to become inactive, thereby disabling SGD and SGS switches of inactive memory subblocks 102 at a time T2. As a result, the strings of the inactive memory subblocks 102 are decoupled from the VBL and SRC control lines. In contrast to the control signals SGDI and SGSI, the control signals SGDA and SGSA may remain active, and the SGD and SGS switches to which the active SGDA and SGSA signals are provided remain enabled. As previously described, SGS switches of inactive memory subblocks 102 sharing an SGS control line 120 with the active memory subblock 102 may remain enabled. At a step 520, the control unit 150 may increase the voltage level of the control signal VREAD from a time T3, for instance, until the voltage level of the control signal VREAD increases from the first access voltage V1 to a second access voltage V2 (e.g., 8 V) at a time T4.

In this manner, the voltage level of the control signal VREAD may be increased to a first access voltage V1 while SGD and SGS switches of all memory subblocks 102 are enabled, and may be increased to a second access voltage V2 while only SGD and SGS switches of a selected memory subblock 102 are enabled (SGS switches of unselected memory subblocks 102 sharing a SGS control line 120 with the selected memory subblock 102 may be enabled as well). Thus, the channel voltage VCHANNEL of inactive memory subblocks 102 may increase only during a time when the voltage level of the control signal VREAD is increased from the first access voltage to the second access voltage, and the resulting magnitude of the channel voltage VCHANNEL during a read operation may be reduced. Because gate-induced drain leakage (GIDL) of strings having disabled SGD and SGS switches may depend on the magnitude of the channel voltage VCHANNEL, reducing the magnitude of the channel voltage VCHANNEL may reduce GIDL. Because read disturb may result from GIDL, reducing the magnitude of the voltage VCHANNEL may in turn reduce read disturb.

Figure 6:
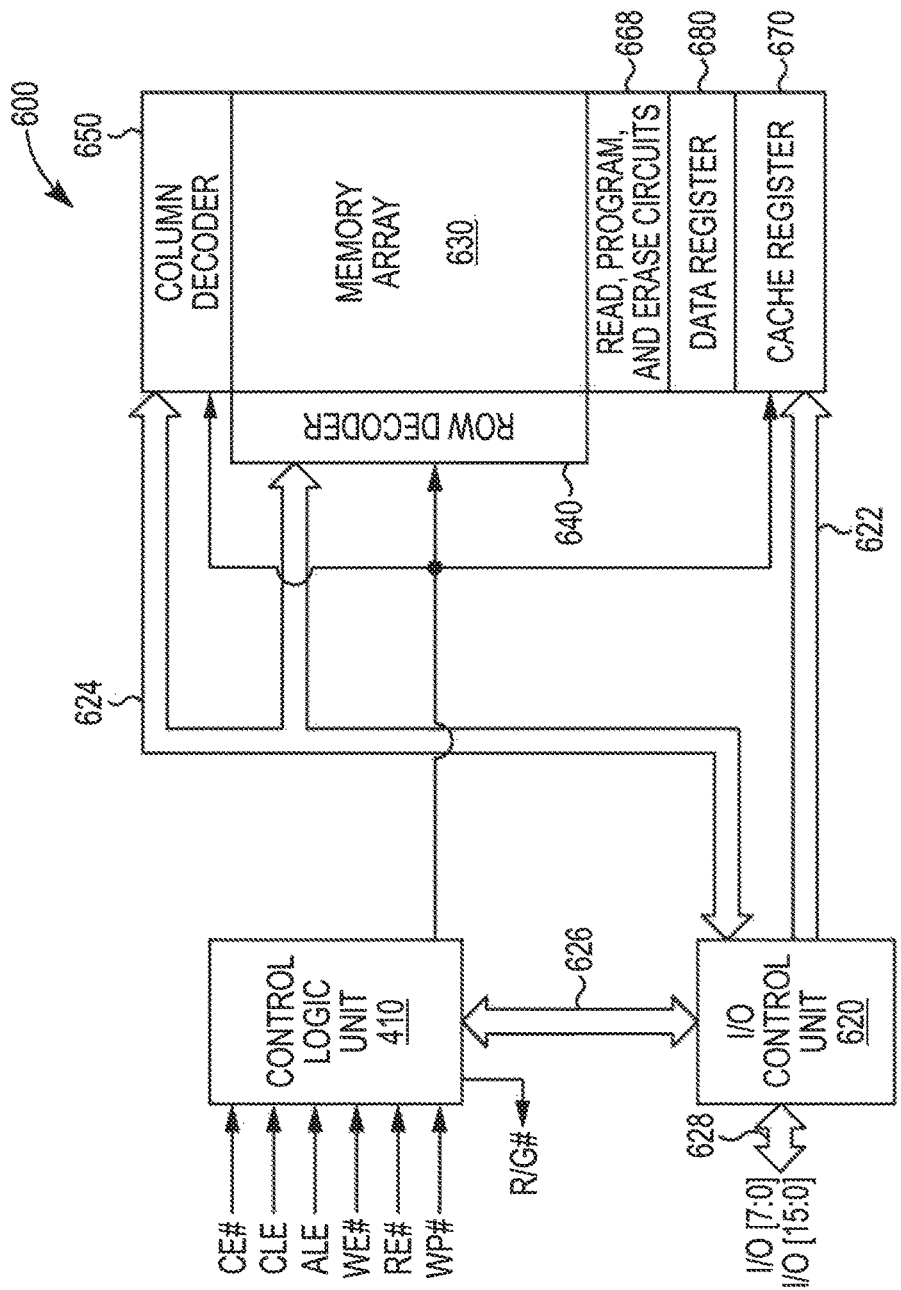
FIG. 6 is a block diagram of a memory according to an embodiment of the present invention.

FIG. 6 illustrates a memory 600 according to an embodiment of the present invention. The memory 600 includes a memory array 630 with a plurality of memory cells. The memory cells may be non-volatile memory cells, such as NAND flash cells, or may generally be any type of memory cells. In some examples, the memory array 630 may include one or more memory blocks, such as a memory block 100 of FIG. 1. Moreover, the memory array 630 may be implemented as a three-dimensional memory array, such as the three-dimensional memory array 200 of FIG. 2.

Command signals, address signals, and write data signals may be provided to the memory 600 as sets of sequential input/output ("I/O") signals transmitted through an I/O bus 628. Similarly, read data signals may be provided from the memory 600 through the I/O bus 628. The I/O bus 628 is connected to an I/O control unit 620 that routes the signals between the I/O bus 628 and an internal data bus 622, an internal address bus 624, and an internal command bus 626. The memory 600 also includes a control logic unit 610 that receives a number of control signals either externally or through the internal command bus 626 to control the operation of the memory 600.

The internal address bus 624 applies block-row and/or subblock-row address signals to a row decoder 640 and column address signals to a column decoder 650. The row decoder 640 and column decoder 650 may be used to select blocks of memory or memory cells for memory operations, for example, read, program, and erase operations. The column decoder 650 may enable write data signals to be applied to columns of memory corresponding to the column address signals and allow read data signals to be coupled from columns corresponding to the column address signals.

In response to the memory commands decoded by the control logic unit 610, the memory cells in the memory array 630 are read, programmed, and/or erased. Read, program, erase circuits 668 coupled to the memory array 630 receive control signals from the control logic unit 610 and include voltage generators (e.g., charge pumps) for generating various pumped voltages for read, program and erase operations.

After the row address signals have been applied to the internal address bus 624, the I/O control unit 620 routes write data signals to a cache register 670. The write data signals are stored in the cache register 670 in successive sets each having a size corresponding to the width of the I/O bus 628. The cache register 670 sequentially stores the sets of write data signals for an entire row or page of memory cells in the memory array 630. All of the stored write data signals are then used to program a row or page of memory cells in the memory array 630 selected by the block-row address or subblock-row address coupled through the internal address bus 624. In a similar manner, during a read operation, data signals from a row or block of memory cells selected by the block-row address coupled through the internal address bus 624 are stored in a data register 680. Sets of data signals corresponding in size to the width of the I/O bus 628 are then sequentially transferred through the I/O control unit 620 from the data register 680 to the I/O bus 628.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus, comprising:
a control unit coupled to a first select gate drain switch of a first memory subblock and a second select gate drain switch of a second memory subblock and a first select gate source switch of the first memory subblock and a second select gate source switch of the second memory subblock, the control unit configured to enable the first and second select gate drain switches and the first and second select gate source switches during a first portion of a read operation and to provide a first voltage on an access line coupled to memory cells of the first and second memory subblocks during the first portion of the read operation, the control unit further configured to disable the first select gate drain switch and the first select gate source switch during a second portion of the read operation and to provide a second voltage on the access line during the second portion of the read operation.

2. The apparatus of claim 1, wherein the control unit is configured to enable one or more of the first and second select gate drain switches and the first and second select gate source switches by providing an active control signal.

3. The apparatus of claim 1, wherein the control unit is configured to disable one or more of the first and second select gate drain switches and the first and second select gate source switches by providing an inactive control signal.

4. The apparatus of claim 1, wherein the second voltage is greater than the first voltage.

5. The apparatus of claim 1, wherein the control unit is configured to charge the access line to the first voltage during the first portion of the read operation.

6. The apparatus of claim 1, wherein the control unit is configured to charge the access line to the second voltage during the second portion of the read operation.

7. The apparatus of claim 1, wherein the control unit is configured to hold a channel voltage of the first memory subblock constant during the first portion of the read operation.

8. The apparatus of claim 7, wherein the control unit is further configured to increase a channel voltage of the first memory subblock constant during the second portion of the read operation.

9. A method comprising:
enabling a first select gate drain switch of a first memory subblock and a second select gate drain switch of a second memory subblock during a first portion of a read operation;
increasing a voltage of a control signal associated with the first and second memory subblocks to a first voltage;
disabling the first select gate drain switch of the first memory subblock during a second portion of the read operation; and
increasing the voltage of the control signal to a second voltage during the second portion of the read operation.

10. The method of claim 9, wherein a channel voltage of the first memory subblock is constant during the first portion of the read operation.

11. The method of claim 10, wherein the channel voltage of the first memory subblock increases during the second portion of the read operation.

12. The method of claim 9, wherein enabling the first and second select gate drain switches comprises providing, by a control unit, an active control signal to a gate of the first and second select gate drain switches.

13. The method of claim 12, wherein disabling the first select gate drain switch comprises providing, by the control unit, an inactive control signal to the gate of the first select gate drain switch.

14. The method of claim 9, further comprising:
enabling a first select gate source switch of the first and second memory subblocks during the first portion of the read operation.

15. The method of claim 14, wherein the first select gate drain switch is disabled responsive to determining that an access line associated with the first and second memory subblocks is charged to the first voltage.

* * * * *